United States Patent [19]
Fujii

[11] Patent Number: 5,852,527
[45] Date of Patent: Dec. 22, 1998

[54] AMPLIFYING CIRCUIT FOR MAGNETIC RECORD AND PLAYBACK APPARATUS HAVING MAGNETIC HEADS WITH FIRST AND SECOND WINDINGS CONNECTED AT A COMMON POINT

[75] Inventor: Toshikazu Fujii, Kanagawa, Japan

[73] Assignee: Kabushiki Kaisha Toshiba, Kawasaki, Japan

[21] Appl. No.: 788,257

[22] Filed: Jan. 24, 1997

Related U.S. Application Data

[60] Continuation of Ser. No. 472,176, Jun. 7, 1995, abandoned, which is a division of Ser. No. 267,407, Jun. 29, 1994, abandoned.

[30] Foreign Application Priority Data

Jun. 30, 1993 [JP] Japan ................................ 5-162394

[51] Int. Cl.$^6$ ................................................ G11B 5/02
[52] U.S. Cl. .................................................. 360/68
[58] Field of Search .............................. 360/46, 61, 64, 360/68, 63, 62, 14.2, 67, 22, 123; 327/58; 330/265, 261

[56] References Cited

U.S. PATENT DOCUMENTS

| | | |
|---|---|---|
| 3,733,443 | 5/1973 | Iwawaki et al. . |
| 4,491,804 | 1/1985 | Main et al. ............................. 330/265 |
| 4,510,459 | 4/1985 | Guisinger ............................. 330/265 |
| 4,633,344 | 12/1986 | Jeffers . |
| 4,713,711 | 12/1987 | Jones, Jr. et al. ..................... 360/123 |
| 4,953,161 | 8/1990 | Toyama ............................... 360/63 X |
| 4,984,117 | 1/1991 | Nolke et al. . |
| 4,987,501 | 1/1991 | Hori ..................................... 360/64 |
| 5,012,356 | 4/1991 | Kosaka ................................ 360/61 |
| 5,119,245 | 6/1992 | Suin .................................... 360/64 |
| 5,132,852 | 7/1992 | Price, Jr. ............................. 360/46 |
| 5,159,211 | 10/1992 | Fujii ................................... 327/58 |
| 5,282,096 | 1/1994 | Morisaki et al. .................... 360/64 |
| 5,337,193 | 8/1994 | Murabayashi et al. .............. 360/19.1 |

FOREIGN PATENT DOCUMENTS

| | | |
|---|---|---|
| 0 468 744 A2 | 1/1992 | European Pat. Off. . |
| 0488892A2 | 6/1992 | European Pat. Off. . |
| 24 10 367 | 9/1975 | Germany . |
| 52-468807 | 4/1977 | Japan . |
| 59-017604 | 4/1984 | Japan . |
| 60-140567 | 7/1985 | Japan . |
| 62-266702 | 11/1987 | Japan . |
| 63-83902 | 4/1988 | Japan . |
| 3-52104 | 3/1991 | Japan . |
| 5-250603 | 9/1993 | Japan . |

OTHER PUBLICATIONS

Patent Abstracts of Japan, vol. 8, No. 265 (P–318), Dec. 5, 1984, JP59132403.
Patent Abstracts of Japan, vol. 16, No. 514 (P–1442), Oct. 22, 1992, JP04188415.
Patent Abstracts of Japan, vol. 13, No. 108 (P–843), Mar. 15, 1989, JP63285705.
Patent Abstracts of Japan, vol. 11, No. 173 (P–582), Jun. 04, 1991, JP2003404.
Patent Abstracts of Japan, vol. 12, No. 303 (P–746), Aug. 18, 1988, JP63074101.
Patent Abstracts of Japan, vol. 8, No. 86 (P–269), Apr. 19, 1984, JP59002203.

*Primary Examiner*—Aristotelis M. Psitos
*Assistant Examiner*—Patrick Wamsley
*Attorney, Agent, or Firm*—Finnegan, Henderson, Farabow, Garrett & Dunner, L.L.P.

[57] ABSTRACT

A DC feed-back circuit for causing a DC voltage of an external transistor in which an output bias current of a record amplifier flows to be equal to a DC voltage of an output terminal is provided so as to decrease power consumption. Thus, a plurality of record amplifying circuits can be incorporated into one IC chip. In particular, in home-use Hi-Fi VCRs, a Hi-Fi record amplifying circuit and video record amplifying circuits can be incorporated into one chip.

4 Claims, 13 Drawing Sheets

AMPLIFYING CIRCUIT FOR MAGNETIC RECORD AND PLAYBACK APPARATUS HAVING MAGNETIC HEADS WITH FIRST AND SECOND WINDINGS CONNECTED AT A COMMON POINT

This application is a continuation of application Ser. No. 08/472,176, filed Jun. 7, 1995, now abandoned, which is a divisional of application Ser. No. 08/267,407, filed Jun. 29, 1994, now abandoned.

BACKGROUND OF THE INVENTION

1. Field of the Invention

The present invention relates to an amplifying circuit for a magnetic record and playback apparatus, in particular, to an amplifying circuit disposed on a rotary cylinder of a magnetic record and playback apparatus.

2. Description of the Related Art

FIG. 10A and FIG. 10B show an example of an amplifying circuit for a conventional magnetic recording apparatus. A record amplifying circuit IC10a has an input terminal INa and an output terminal OUTa. The output terminal OUTa of the record amplifying circuit IC10a is connected to a primary terminal of a rotary transformer RTa. Another primary side-terminal of the rotary transformer RTa is connected to a power supply Vcc. Secondary terminals of the rotary transformer RTa are connected to magnetic head HDa.

A record amplifying circuit IC10b has an input terminal INb and an output terminal OUTb. The output terminal OUTb of the record amplifying circuit IC10b is connected to a primary terminal of a rotary transformer RTa. Another primary terminal is connected to the power supply Vcc. Secondary terminals of the rotary transformer RTb are connected to a magnetic head HDb.

Circuits, including the record amplifying circuits IC10a and IC10b, connected to the primary side of the rotary transformers RTa and RTb are disposed on a circuit board of a magnetic recording apparatus. On the other hand, circuits, including the magnetic heads HDa and HDb, connected to the secondary side of the rotary transformers RTa and RTb are disposed on a rotary cylinder (not shown).

The record amplifying circuits IC10a and IC10b are employed for the most of magnetic recording apparatuses. Although a DC current must not be supplied to the magnetic heads, the rotary transformers prevent DC components from being supplied, bias currents of ICs do not flow to the magnetic heads. Thus, the degree of freedom of ICs becomes large from a design point of view. In addition, since the record amplifying circuit IC disposed on the circuit board and the magnetic heads disposed on the rotary cylinder are connected electrically, not mechanically, frictional noise due to rotations of the rotary cylinder does not take place. In other words, it can be said that this record amplifying circuit properly operates.

Since the description with respect to the record amplifying circuit IC10a can apply to the record amplifying circuit IC10b, only the record amplifying circuit IC10a will be described. Assume that the primary inductance of the rotary transformer RTa is L1; the secondary inductance of the rotary transformer is L2; the coupling coefficient of the rotary transformer RTa is k; the inductance of the magnetic head HDa is Lh; the output current of the record amplifying circuit IC10a is Is; and the record current that flows in the magnetic head HDa is Ir. The record current Ir, which flows in the magnetic head HDa, is given by the following equation.

$$Ir = \frac{k \cdot \sqrt{L1 \times L2}}{L2 + Lh} Is \tag{1}$$

The rotary transformer RTa preferably has a large inductance. As the inductance of the rotary transformer RTa increases, the self resonance frequency of the rotary transformer lowers. Thus, the required transmission band cannot be flatly formed. When the magnetic recording apparatus operates in playback mode, the rotary transformer RTa is connected to a playback amplifying circuit. Since noise that takes in the amplifying circuit against a weak signal is relatively lowered, this step-up effect of the rotary transformer is often used. In other words, the relation of L1>L2 is employed. Now, assume that the coupling coefficient is ideally k=1.0; the step-up ratio of the rotary transformer is 2; the primary inductance L1 of the rotary transformer Ra is 2.0 μH; the secondary inductance L2 of the rotary transformer Ra is 12.0 μH; and the inductance Lh of the magnetic head HDa is 2.0 μH. Although these values vary depending on the design of each magnetic recording apparatus, they are relatively standard values.

The record current Ir of home-use VCRs should be in the range of 30 mA to 35 mA. In addition, the second order distortion should be 40 dB or less. When each value is substituted into the equation (1), Ir=1.2×Is is obtained. Thus, the output current Is of the record amplifying circuit IC10a should be 24 mA to 30 mA. To suppress the second order distortion, the output bias current and the signal current of the record amplifying circuit should be 30 mA to 35 mA or higher. When the power voltage of the record amplifying circuit IC10a is 5 V, the power consumption of this portion becomes 5 V×30 mA=150 mA. The record amplifying circuit also includes a drive circuit and a bias circuit. Thus, the record amplifying circuit requires 200 mW of power consumption in total.

Particularly, in VHS Hi-Fi VCRs, the amplitude of the record current Ir should be precisely controlled. The amplitude of the record current Ir is controlled by a circuit shown in FIG. 11. One end of the primary side of the rotary transformer RT shown in FIG. 10A is directly connected to the power supply Vcc. However, in the circuit shown in FIG. 11, one end of the primary side of a rotary transformer RT is connected to a power supply Vcc through a resistor $R_{MON}$ that has small resistance.

The resistor circuit shown in FIG. 11 is a monitor circuit that adjusts a record current flowing in a magnetic head HD.

In the VHS Hi-Fi VCRs, after a Hi-Fi record signal has been recorded on a deep layer of a magnetic tape, the signal is read from the outer surface of the magnetic tape. Since the Hi-Fi record signal is written with an intensity of nearly saturation level of the magnetic tape, the accuracy of the record current is not important. However, in the case of a video record signal that is overwritten onto the magnetic tape, if the intensity of the record current of the video record signal is too strong, the Hi-Fi record signal will be erased. In contrast, if the intensity of the record current of the video record signal is too weak, it will not be properly recorded. Thus, the accuracy of record current of the video record signal, which is overwritten, should be approximately ±15%. Since it is difficult to measure the record current of the rotary cylinder, the record current on the primary side of the rotary transformer RT should be monitored and the record level should be adjusted by varying the gain of the record amplifying circuit.

When the output current that flows in the record amplifying circuit IC10a is denoted by Is, the record current Ir that flows in the magnetic head HD is given by the following equation.

$$Ir = \frac{k \cdot \sqrt{L1 \cdot L2}}{L2 + Lh} Is \quad (2)$$

In this equation, assume that the values of inductances of the rotary transformer shown in FIG. 11 are the same as those shown in FIG. 10A and FIG. 10B. In addition, assume that the values of the inductances of the rotary transformer have deviations of ±10% or higher. Thus, the following relation is given.

$$\frac{Ir(RT = +10\%)}{Ir(RT = \text{Center})} = 1.038$$

When the deviations of the inductances of the rotary transformer are approximately ±10%, the deviation of the record current is ±4%. In addition, the head inductance also deviates by approximately ±0.3 μH, which is equivalent to a deviation of ±6% of record current. In total, the deviation of the record current is as many as ±10%. Moreover, the coupling coefficient of the rotary transformer deviates. However, the deviation of the current on the primary side of the rotary transformer should be ±5% or less.

FIG. 12 is a schematic diagram showing a playback amplifying circuit that is disposed on a rotary cylinder. This circuit is disclosed in Japanese Patent Laid-Open Publication No. 63-83902. In record mode, a switch SW1 and a switch SW2 are closed and a switch SW3 is open. A record current flows to a magnetic head HD and the switch SW1 through a rotary transformer RT. On the other hand, in playback mode, the switches SW1 and SW2 are open and the switch SW3 is closed. A playback signal is amplified by a playback amplifying circuit 12. The amplified playback signal is sent to a signal processing circuit disposed on a circuit board through the rotary transformer RT.

If the playback amplifying circuit 12 has been properly designed, it will be not affected by noise that takes place in the vicinity of the rotary transformer RT. In addition, since the distance of the signal line that transmits a weak signal becomes short, it is less affected by noise. However, the gain of the playback amplifying circuit 12 for use with the conventional home-use VCR is as large as 60 dB. In addition, since the inductances of the magnetic head HD and the rotary transformer RT are low, it is very difficult to accomplish the switches SW1 to SW3. Since these circuits are disposed on the rotary cylinder, active switches using transistors should be used from size and cost points of view.

The switches SW1 to SW3 in the circuit shown in FIG. 12 may be apparently disposed in parallel with the signal pass. However, these switches SW1 to SW3 are substantially disposed in series with the signal path from operational point of view. Regardless of the record mode and playback mode, a signal current flows in these switches. Thus, the impedances of the switches are very important.

In the record mode, the switches SW1 and SW2 are connected in series with the secondary inductance of the rotary transformer RT and the head. Now, assume that each constant of the above-described construction is applied likewise and the impedances of the switches SW1 and SW2 are denoted by Rs1 and Rs2. At this point, the record current Ir that flows in the magnetic head HD is given by the following equation.

$$Ir = \frac{k \cdot \sqrt{L1 \cdot L2 \cdot s}}{s \cdot L2 + s \cdot Lh + Rs1 + Rs2} Is \quad (3)$$

where s=jω (ω:angular frequency). In other words, the record current should have high-pass characteristic. To allow low frequency components of the record current to pass, the impedances Rs1 and Rs2 of the switches SW1 and SW2 should be very low. In the home-use VCRs, since a chroma signal should be converted at a low frequency region and modulated at 629 kHz, signals with frequencies of 100 kHz or less should be passed. In the case that the value of each inductance of the above-described construction is applied, the relation of Rs1+Rs2<3.14 Ω should be satisfied. In other words, the on-resistances of saturation switches should be 1.5 Ω or less.

In the playback mode, the feed-back amount depends on the inductance of the rotary transformer RT and the on-resistance of the switch SW3. If the gain of the playback amplifying circuit is as large as 60 dB, the feed-back amount should be decreased at least 1/1000 times. Since the impedances of the magnetic head HD and the rotary switch are low, it is clear that such a construction is difficult to accomplish. In addition, the phase of the original signal differs from the phase of the feed-back signal. Moreover, the size of the switch SW1 is reversely proportional to the on-resistance thereof. As the size of the switch SW1 increases, the parasitic capacitance thereof increases. Thus, as the size of the switch SW1 increases, the input capacitance of the playback amplifying circuit 12 increases. Consequently, it is difficult to compensate the phase of the playback amplifying circuit 12. In addition, the frequency characteristic of the playback path will be deteriorated.

As described above, the record amplifying circuit for the magnetic record and playback apparatus has various problems. In the Hi-Fi VCRs, which have been widely used as home-use magnetic recording apparatuses, A and B channels of the Hi-Fi sound signals and A and B channels of video signals are recorded at the same time. As described above, each of the four record amplifying circuits requires approximately 200 mW of power consumption. If these circuits were incorporated into one chip, the power consumption of the chip would be as many as 800 mW. However, the capacity of the power consumption of a small package is at most 500 mW. In conventional VCRs, different ICs are used for Hi-Fi sound signals and video signals, thereby rising the cost thereof. If a large package were used, all circuits would be incorporated into one chip. When the size of the package increases, the cost thereof rises. Thus, in the conventional VCRs, such circuits are not incorporated into one chip.

When the record amplifying circuits are disposed on the rotary cylinder from another advantageous point of view, the area of the circuit board becomes very small. Thus, a small package is required. In other words, by the conventional technologies, record amplifying circuits of a Hi-Fi VCR cannot be incorporated into one chip and disposed on a rotary cylinder. Although the record amplifying circuits may be incorporated into two chips, the effect of cost reduction will be lost. In addition, one chip is more easily disposed on the rotary cylinder than two chips.

In the case of the Hi-Fi VCRs, since the accuracy of the record current to be adjusted should be ±5%, it is difficult to automatically adjust the record current. Conventionally, the record current is manually adjusted with a measuring unit, thereby raising the cost of the VCRs.

When the playback amplifying circuits are disposed on the rotary cylinder, active switches that switch between record mode and playback mode should have very low impedances. Thus, it was difficult to accomplish these switches without a tradeoff of deterioration of characteristics (such as low band characteristic).

SUMMARY OF THE INVENTION

An object of the present invention is to provide a record amplifying circuitry including Hi-Fi record amplifying circuits and video record amplifying circuits that are incorporated into one chip, that can automatically adjust a record current, and that can be disposed on a rotary cylinder.

To accomplish the above-described object, the amplifying circuit for the magnetic record and playback apparatus according to the present invention, comprising an external transistor for allowing an output bias current of the record amplifying circuit to flow, and a DC feed-back circuit for keeping the DC voltage of an output terminal to be constant so as to reduce power consumption.

The amplifying circuit according to the present invention further comprises a means for differentially driving video record heads and serially Hi-Fi driving record heads for home-use Hi-Fi VCRs.

The amplifying circuit according to the present invention further comprises a rotary transformer input circuit and a current amplifying circuit disposed on a rotary cylinder, the rotary transformer input circuit has a low impedance.

The amplifying circuit according to the present invention further comprises switches for switching between the record amplifying circuits and the playback amplifying circuits, output terminals of the record amplifying circuits being in common with output terminals of the playback amplifying circuits, a neutral point of magnetic heads connected in series being connected to the playback amplifying circuits, the switches being disposed at input portions of the playback amplifying circuits and output portions of the record amplifying circuits.

Each of the record amplifying circuits disposed on the rotary cylinder comprises a constant voltage circuit and a reference current generating circuit with an external reference resistor for determining a bias current of each of the record amplifying circuits.

According to the present invention, power consumption of IC can be reduced. In addition, a plurality of record amplifying circuits can be incorporated into one chip. In particular, in home-use Hi-Fi VCRs, Hi-Fi record amplifying circuits and video record amplifying circuits can be incorporated into one chip.

When record amplifying circuits are disposed on a rotary cylinder, the gain errors of the record amplifying circuits are remarkably reduced. In addition, with a record-playback switching means that decreases on-resistances of the record-playback switches, record and playback amplifying circuits including the switches can be easily incorporated into an IC. With this switching means, even if the record amplifying circuits are disposed on the rotary cylinder, low band are not deteriorated.

These and other objects, features and advantages of the present invention will become more apparent in light of the following detailed description of a best mode embodiment thereof, as illustrated in the accompanying drawings.

DESCRIPTION OF PREFERRED EMBODIMENTS

Figure 1:
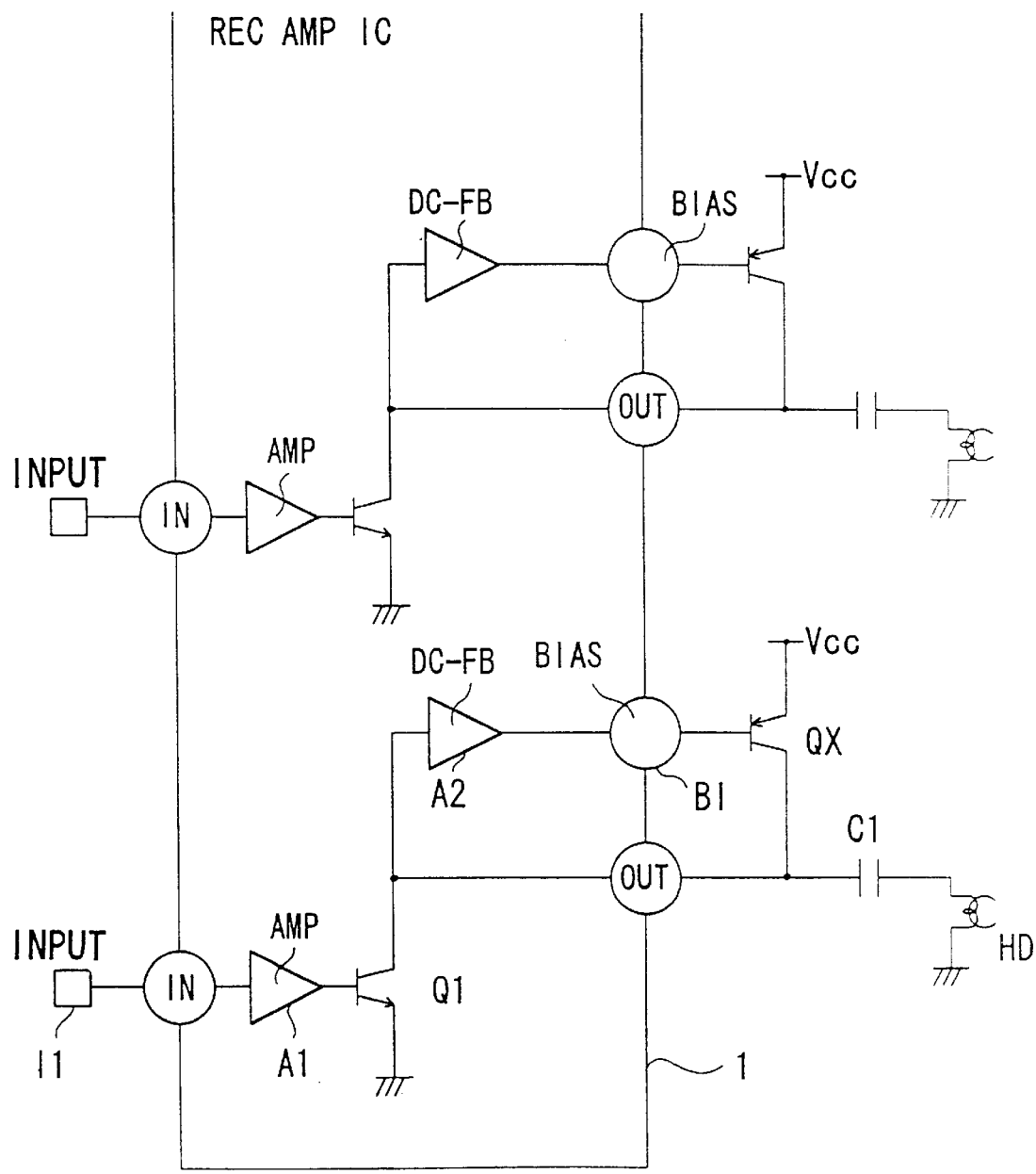
FIG. 1 is a schematic diagram showing a construction of a circuit according to an embodiment of the present invention.

Next, with reference to the accompanying drawings, embodiments of the present invention will be described. Referring to FIG. 1, an IC1 includes two record amplifying circuits. When two Hi-Fi recording channels, two standard-mode video recording channels, and two economy (6-hour) mode video recording channels are incorporated into the IC1, since the number of similar circuits increases, for the simplicity, the description of the similar circuits is omitted. Thus, only one record amplifying circuit pair will be described.

An input I1 receives an input signal. The input I1 is connected to an input terminal IN of a record amplifying circuit IC1. In addition, the input terminal IN is connected to an amplifier A1. An output of the amplifier A1 is connected to the base of a transistor Q1. The collector of the transistor Q1 is connected to both an output terminal OUT of the record amplifying circuit IC1 and a bias terminal BI of the record amplifying circuit IC1 through a DC feed-back circuit A2. The bias terminal BI is also connected to the base of an external transistor QX. The emitter of the transistor QX is connected to a power supply Vcc. The collector of the transistor QX is connected to both an output terminal OUT and a magnetic head HD through a condenser C1.

The DC feed-back circuit A2 detects a DC voltage of the output terminal OUT of the record amplifying circuit IC1 and adjusts the collector current of the external transistor QX so that the DC voltage of the output terminal OUT becomes a predetermined value.

In this record amplifying circuit, the condenser C1 causes DC component not to be supplied to the magnetic head HD.

The bias current on the output stage of the recording circuit flows to the ground through the external transistor QX and the output transistor Q1 of the IC1.

Figure 10A:
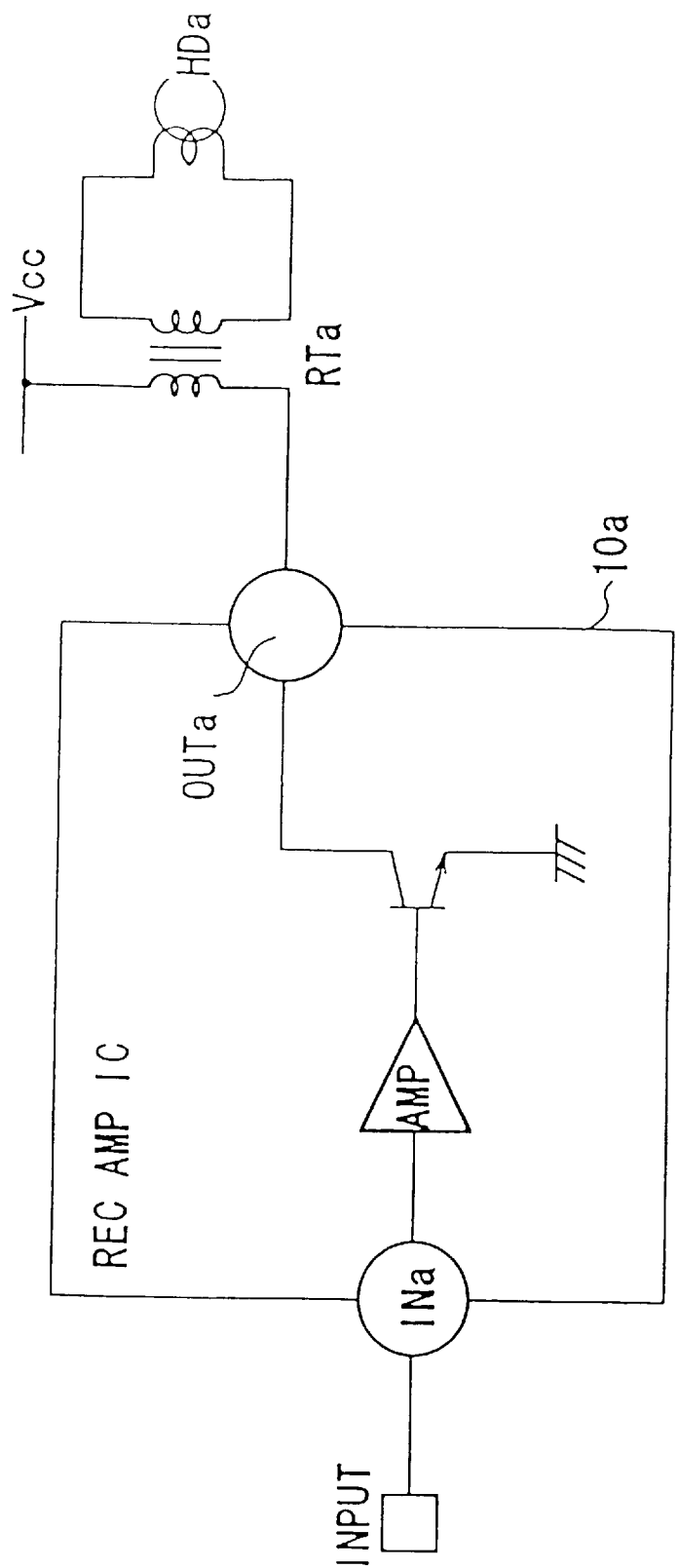
FIG. 10A is a a schematic diagram showing a construction of a circuit for adjusting a record current according to a related art reference.
Figure 10B:
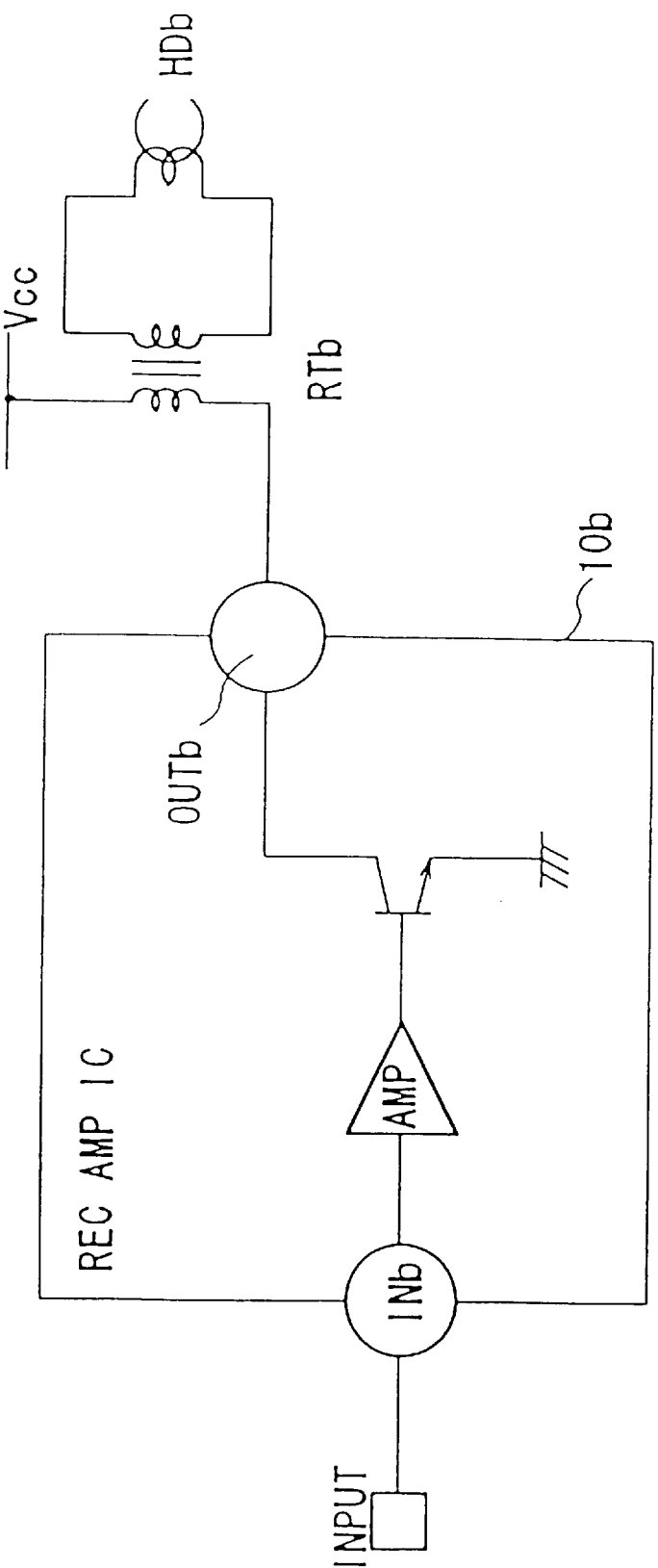
FIG. 10B is a a schematic diagram showing a construction of a circuit for adjusting a record current according to a related art reference.

Now, assume that the power voltage Vcc is 5.0 V and the voltage of the output terminal is 2.5 V. As with the construction shown in FIG. 10A and FIG. 10B, if a bias current of 30 mA is supplied to the output stage, the power consumption in the external transistor QX is 2.5 V×30 mA=75 mW. In addition, the power consumption in the record amplifying circuit IC1 is 2.5 V×30 mA=75 mW. Thus, the power consumption in the record amplifying circuit IC1 is the half of that of FIG. 10A and FIG. 10B. Consequently, the power consumption in total of four channels of the Hi-Fi record heads (A and B channels) and the video record heads (A and B channels) is 75 mW×4=300 mW. In the related art reference shown in FIG. 10A and FIG. 10B, the power consumption of other circuits such as the drive circuit is 50 mW. Thus, the total power consumption for four channels of the other circuits is at most 200 mW. Even if the four channels of the Hi-Fi record amplifying circuits and the video record amplifying circuits are incorporated into one chip, the power consumption thereof is 500 mW. Thus, these circuits can be sufficiently incorporated in a small package.

In the most of home-use VHS VCRs, different record heads may be used for the standard play (SP) mode and economy play (EP) mode. However, since the SP mode and the EP mode do not operate at a time, either of record amplifying circuits can be turned off. Thus, even if different heads are used for the standard mode and the economy mode, the power consumption does not increase. In other words, according to this embodiment, two channels of Hi-Fi record amplifying circuits, two channels of the standard mode video record amplifying circuits, and two channels of the economy mode video record amplifying circuits (namely, a total of six channels of the record amplifying circuits) can be incorporated into one chip.

When the record amplifying circuit IC1 is disposed on the rotary cylinder, the external transistor QX should be also small. Since the power consumption of a super-mini type transistor, which is a conventional chip transistor, is 150 mW, it is much larger than 75 mW of the power consumption of the external transistor QX. Thus, the power consumption required of the external transistor QX is sufficiently less than the power consumption required of the super-mini type transistor.

In this embodiment, the external transistor QX is additionally provided. However, since the cost of the chip transistor is at most several yen in Japanese currency, the effect of cost reduction of the one-chip construction is improved. Thus, the one-chip IC using the record amplifying circuit according to the present invention has an advantage in cost.

Figure 2:
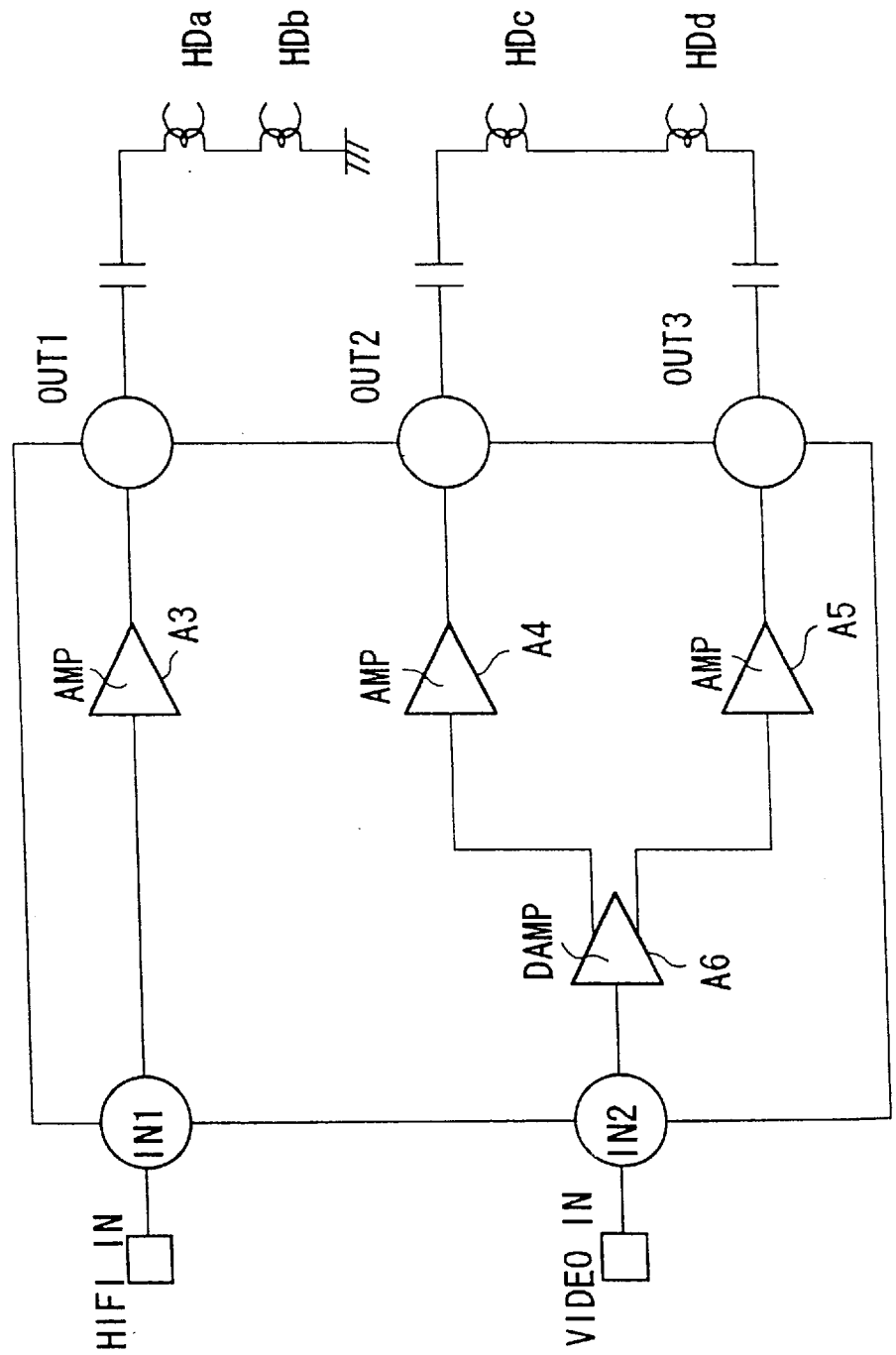
FIG. 2 is a schematic diagram showing a construction of a circuit for a differential drive and a serial drive according to an embodiment of the present invention.

FIG. 2 is a schematic diagram showing another embodiment of the present invention. This embodiment is a circuit for reducing power consumption of a record amplifying circuit for use in home-use Hi-Fi VCRs.

In the VHS Hi-Fi VCRs, FM carrier frequencies of L and R channels of Hi-Fi record signals are 1.3 MHz and 1.7 MHz, respectively. The band widths of the carrier frequencies of the L and R channels are narrow so as to prevent them from interfering with video signals. The band widths of the Hi-Fi record signals are at most in the range of 1 MHz to 2 MHz. On the other hand, the frequencies of video record signals that have been converted into low band frequencies are 100 kHz or higher. The frequencies of luminance signals that have been frequency modulated spread out up to 4.4 MHz at white peak. In the SVHS system, the frequencies of the luminance signals spread out up to 6.4 MHz at white peak.

Magnetic heads have inductances. Thus, as the frequencies of signals supplied to the magnetic heads rise, the impedances thereof increase. In other words, when a record current is constant, the higher the frequency of a signal, the larger the voltage amplitude thereof. The record level of a magnetic tape is proportional to the number of turns of the coil thereof and the intensity of the record current. Thus, the intensity of the Hi-Fi record current is almost the same as the intensity of the video record current. With respect to the voltage amplitude, the voltage induced in a Hi-Fi record head is the half or less than the voltage induced in a video record head.

Assume that the record current that flows in each of the Hi-Fi heads and the video heads is 30 mApp and the inductance thereof is 2.0 $\mu$H. When f=1.5 MHz, the voltage induced in each of the Hi-Fi heads is $2\pi \times 1.5$ (MHz)×2.0 ($\mu$H)×30 (mApp)=0.57 (Vpp). On the other hand, when f=5 MHz, the voltage induced in each of the video heads is $2\pi \times 5$ (MHz)×2.0 ($\mu$H)×30 (mApp)=1.8 (Vpp). In other words, when the power voltage of the IC is 5 V, it is sufficient for the power voltage of the Hi-Fi record amplifying circuit. The voltage induced in two Hi-Fi heads connected in series is smaller than the voltage induced in one video head.

In FIG. 2, the record amplifying circuit A3 drives two Hi-Fi record heads HDa and HDb that are connected in series. The two recording amplifying circuits A4 and A5 differentially drives the two video record heads HDc and HDd that are connected in series. An input signal received from an input terminal IN2 is supplied to a single input differential output amplifier A6. The single input differential output amplifier A6 converts the input signal into differential signals. The record amplifying circuits A4 and A5 output the differential signals.

Since the voltage induced in each of the record heads HDa and HDb is approximately 0.6 Vpp, when the two record heads HDa and HDb are connected in series, the voltage induced therein is approximately 1.2 Vpp, which is sufficiently lower than 5 V of the power supply. In addition, since the record amplifying circuits are of a current output type, the power consumption thereof does not vary regardless of the number of heads connected. In other words, with this drive circuit, the power consumption can be halved. When the Hi-Fi recording circuit and the video recording circuits are incorporated into one chip, it is not advantageous to provide independent power supplies from cost point of view. Thus, with respect to the Hi-Fi record amplifying circuit, the circuit for driving heads connected in series is very advantageous in circuit area (cost) and power consumption. In addition, the frequencies of video record signals are high and the voltage amplitude hereof is large. Thus, this Hi-Fi recording circuit is inferior to the related art reference in distortion. To suppress the distortion of the video recording circuits in the same level as the conventional Hi-Fi recording circuit, the intensity of the bias current that flows in the video recording circuits should be increased, thereby increasing current consumption.

In this embodiment, the video recording circuits differentially drive the heads connected in series. Theoretically, second order distortion is cancelled. Since video signals have been frequency modulated, the second order distortion is a post-modulation distortion. Thus, the second order distortion should be suppressed as low as possible. However, third order distortion is not a post-modulation distortion. The differential drive circuit theoretically cancels all even-order distortions. Thus, the even-order distortions can be substantially decreased. By effectively using this characteristic, the bias current of the video recording circuits can be decreased as low as possible (for example, to approximately 20 mA).

Now, assume that the Hi-Fi record amplifying circuit and the video record amplifying circuits are integrated into one chip so as to calculate the power consumption thereof. Although the bias current of the Hi-Fi recording circuit is 30 mA, when the heads are connected in series, two channels can be driven. Thus, with 30 mA×5 V=50 mW, two channels of the heads can be driven. The total power consumption of the Hi-Fi record amplifying circuit including a drive circuit thereof is approximately 200 mW. Since the video recording circuits differentially drive two heads, the bias current on the output stage is decreased. When the bias current is 20 mA, two channels are driven with 20 mA×5 V×2=200 mW. The total power consumption of the video record amplifying circuits including two drive circuits thereof is 300 mW. The total power consumption of the Hi-Fi record amplifying circuit and the video record amplifying circuits is 200 mW+300 mW=500 mW. Thus, even if the Hi-Fi record amplifying circuit and the video record amplifying circuits are integrated into one chip, the power consumption of the chip can be suppressed to 500 mW.

In the calculations used in this embodiment, the effect of the first embodiment shown in FIG. 1 is not considered. The first embodiment shown in FIG. 1 and the second embodiment shown in FIG. 2 disclose technologies that reduce the power consumption in different manners. Thus, when both the first embodiment and the second embodiment are applied at a time, a record amplifying circuit IC that lesser consumes power than the first and second embodiments do can be accomplished. In each of the first and second embodiments shown in FIGS. 1 and 2, the record amplifying circuit is disposed on the rotary cylinder. However, since the power consumption does not relate to whether or not the record amplifying circuit IC is disposed on the rotary cylinder, the spirit of each of the first and second embodiments can be applied to a record amplifying circuit IC disposed on a conventional circuit board.

Figure 3:
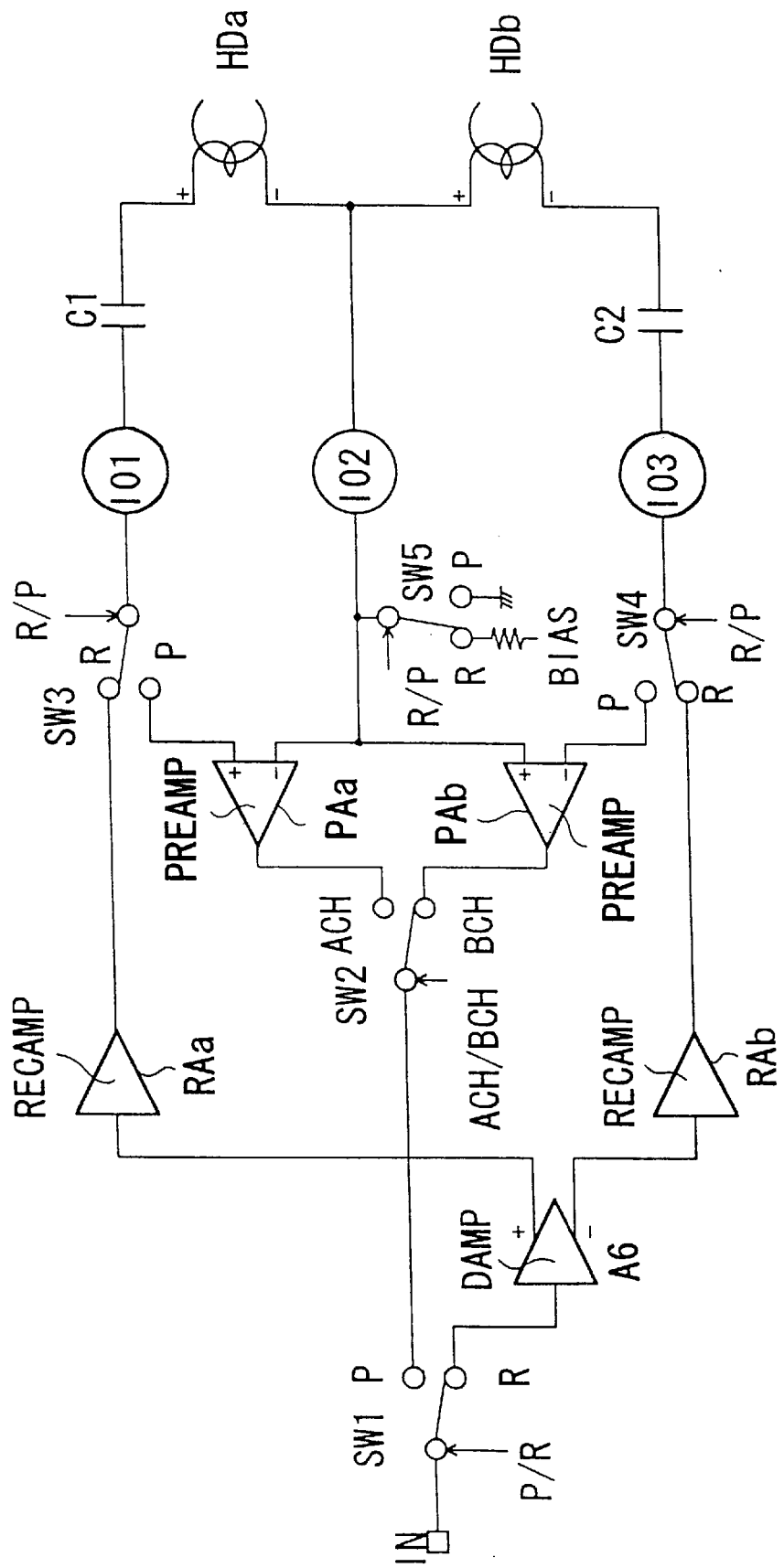
FIG. 3 is a schematic diagram showing a construction of a record-playback switching circuit for a differential drive circuit according to an embodiment of the present invention.

FIG. 2 shows the recording circuit that differential drives heads and the recording circuits that drive heads connected in series. In this construction, since the polarity of the record current varies, a unique record-playback switching circuit that is different from the related art reference is required. FIG. 3 shows a record-playback switching circuit for the differential drive circuit according to an embodiment of the present invention. Since the switching circuit according to this embodiment does not depend on the impedance of a saturation switch unlike with the conventional switching system shown in FIG. 12, the switching system can be easily accomplished by an electronic circuit. In addition, the switching circuit can be incorporated into an IC. Moreover, the switching circuit according to this embodiment has excellent characteristics.

In FIG. 3, switches SW1, and SW3 to SW5 are switched between record mode and playback mode. In the record mode, a common terminal of each of these switches is connected to R terminal. In the playback mode, the common terminal is connected to P terminal. In FIG. 3, A6 is a single input differential output amplifier that converts a record signal into a differential signal. RAa and RAb are record amplifying circuits. PAa and PAb are playback amplifying circuits. HDa is an A channel head. HDb is a B channel head. SW2 is a switch that selects A channel or B channel in the playback mode. HDa and HDb are magnetic heads that are disposed on a rotary cylinder. To electrically connect the magnetic heads HDa and HDb to the rotary cylinder, parts such as rotary transformers or slip rings are required. However, when record and playback amplifying circuits are disposed on a conventional circuit board, rotary transformers or slip rings are disposed between output terminals IO1 to IO3 and the magnetic heads HDa and HDb.

When record and playback amplifying circuits are disposed on a rotary cylinder, rotary transformers or slip rings are disposed between an input terminal IN and the switch SW1. In the latter case, the number of channels of rotary transformers or slip rings can be decreased. Since the rotary transformers or slip rings are expensive parts, when the number of channels thereof is reduced, the cost can be remarkably reduced.

Next, the operation of the record mode of the circuit shown in FIG. 3 will be described. Each of the switches SW1, SW3, SW4, and SW5 is connected to the R terminal. Since the switch SW2 is not used in the record mode, it may be connected to any terminal. A record signal that is input to the input terminal IN is supplied to the single input differential output amplifier A6. The single input differential output amplifier A6 converts the record signal into a differential record signal. The differential record signal is supplied to the record amplifying circuits RAa and RAb. Outputs of the record amplifying circuits RAa and RAb are supplied to the record heads HDa and HDb through the switches SW3 and SW4 and condensers C1 and C2, respectively. In other words, the record current differentially flows to the output terminals IO1 and IO3.

The switch SW5 turns off the playback amplifying circuits PAa and PAb. Thus, it does not directly relate to the record operation. Since the output terminal IO2 is AC grounded in ideal operation, the record signal does not flow thereto. If the impedance of each of the magnetic heads or the record current deviates, the voltage of the output terminal IO2 proportionally varies.

Although the record heads HDa and HDb are differentially driven, since they are connected in series, the record heads HDa and HDb have respective polarities. In this embodiment, assume that the polarities of the upper sides and lower sides of the record heads are "+" and "−", respectively, as shown in FIG. 3. In the playback mode, the connecting point of the record heads HDa and HDb is grounded so as to extract a signal. At this point, the polarity of the A channel should be different from the polarity of the B channel.

In the playback mode, the switches SW1, and SW3 to SW5 are connected to P terminals. Referring to the upper half portion of FIG. 3, the output terminal IO2 at a neutral point of the heads is grounded by the switch SW5. A playback signal that takes place at the output terminal IO1 is supplied to the playback amplifying circuit PAa through the switch SW3. The playback amplifying circuit PAa amplifies the playback signal. When the switch SW2 is connected to the A channel position, the amplified playback signal is supplied to the input terminal IN through the switch SW1. Referring to the lower half portion of FIG. 3, since the output terminal IO2 is grounded, a playback signal that takes place at the output terminal IO3 is supplied to the playback amplifying circuit PAb through the switch SW4. The playback amplifying circuit PAb amplifies the playback signal. When the switch SW2 is connected to the B channel position, the amplified playback signal is supplied to the input terminal IN through the switch SW1.

At this point, the polarity of one of the playback amplifying circuits PAa and PAb should be "−" corresponding to the polarities of the record amplifying circuits. In FIG. 3, the polarity of the B channel is "−". As with the record mode, the switch SW5 must not be necessary to the playback mode. This is because the differential inputs of the playback amplifying circuits PAa and PAb compress the signal that takes place at the output terminal IO2. However, since CMRR (Common Mode Rejection Ratio) of the amplifying circuits has a limit, the signal, which may take place at the output terminal IO2, is preferably grounded by the switch SW5 so as to prevent crosstalk from decreasing.

Figure 12:
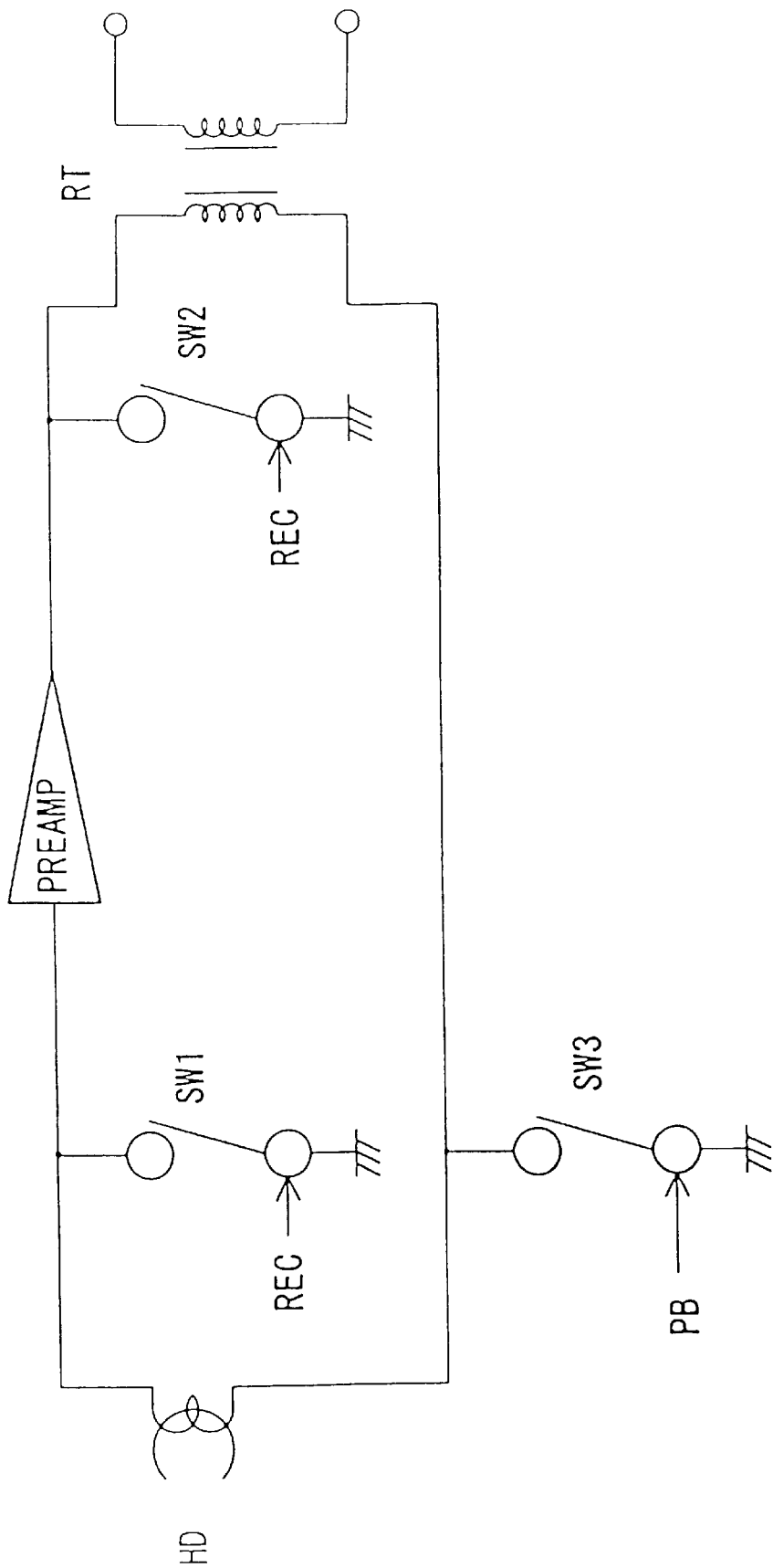
FIG. 12 is a schematic diagram showing a construction of a playback amplifying circuit disposed on a rotary cylinder according to a related art reference.

Such a record-playback switching circuit is more complicated than the circuit shown in FIG. 12. However, the record-playback switching circuit shown in FIG. 3 is easily accomplished with high characteristics. In addition, as described above, since the switch SW5 must not be necessary to the playback mode, it is not necessary to consider the impedance thereof. Since the other switches are merely the switches for selecting modes, it is not necessary to lower their on-resistance. Thus, these switches can be easily accomplished.

When the record and playback amplifying circuits are mounted on a circuit board, rotary transformers are disposed on the head side. In addition, no switches are disposed on the rotary cylinder. Thus, it is clear that since switch-on resistance does not take place, low band frequency characteristics do not deteriorate. When the record and playback amplifying circuits are disposed on the rotary cylinder, the input impedance of the input terminal IN should be lowered. However, since the input terminal IN is separated from the switching circuit, the impedance may be lowered with a feed-back circuit. In this case, a low impedance of 1 Ω or less can be easily accomplished as will be described later.

In the playback mode, in the related art reference shown in FIG. 12, the feed-back operation of a playback amplifying circuit is accomplished only by a switch. Thus, a signal amplified by the playback amplifying circuit is fed back to the input thereof, thereby causing an oscillation. However, according to the this embodiment, such a problem can be prevented. The outputs of the playback amplifying circuits PAa and PAb are temporarily disconnected by the switch SW1. In addition, since the off-resistance of the switches is as low as the parasitic capacitance thereof. A switch with high off-resistance is much easily produced than a switch with low on-resistance.

A feed-back path is formed by the single input differential output amplifier A2 and the record amplifying circuit RAa and RAb. Since these circuits do not relate to the playback operation, they may be deenergized. In other words, the gains of these circuits may be zero. In addition, to shut out signal leakage in the middle of the path of these circuits, a switch may be easily disposed. In other words, according to the switching circuit of the embodiment, since a signal amplified by a playback amplifying circuit is not fed back to the input thereof, no oscillation takes place. In addition, this switching circuit can be easily accomplished.

Figure 4:
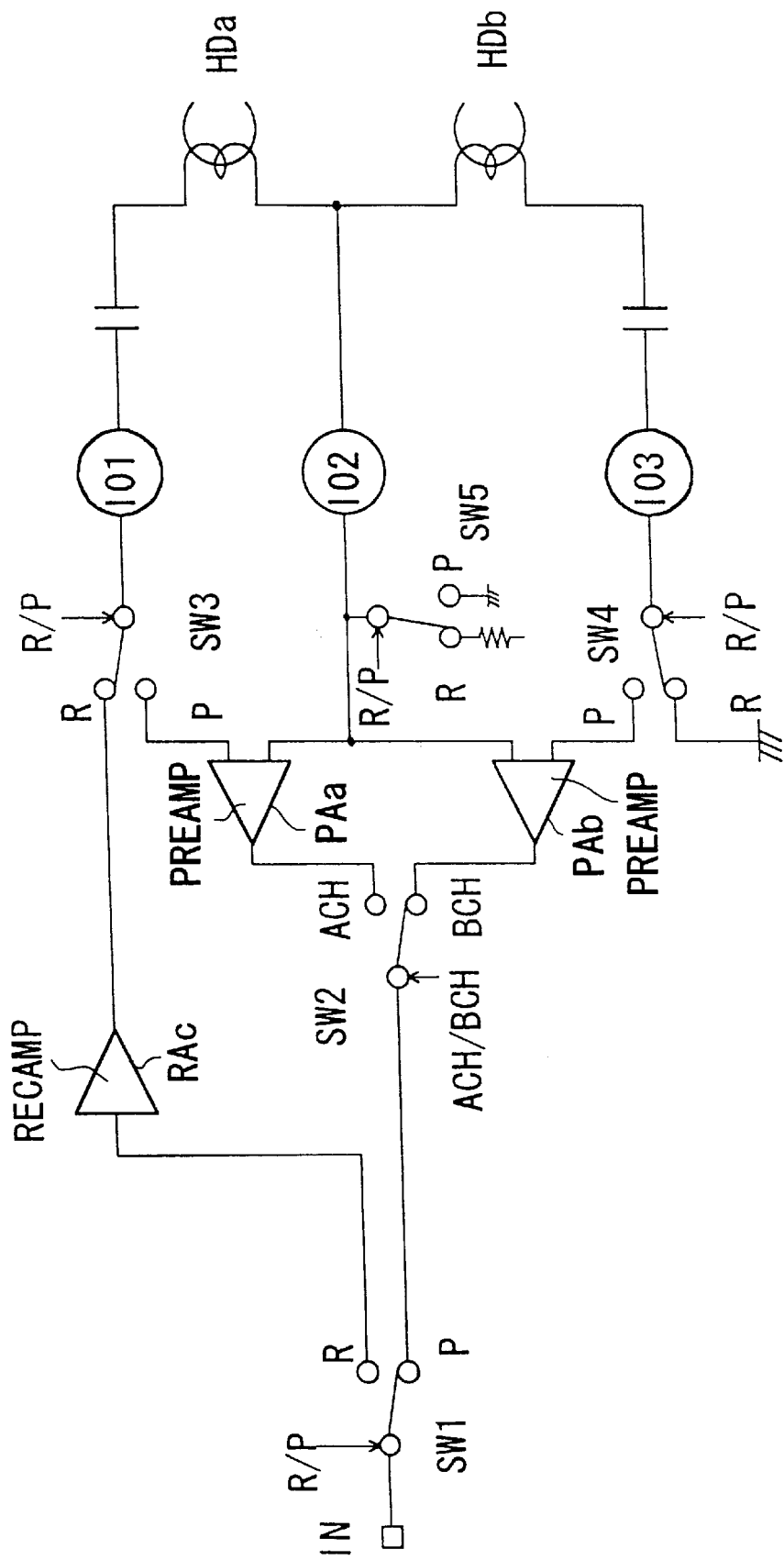
FIG. 4 is a schematic diagram showing a construction of a record-playback switching circuit for a serial drive circuit according to an embodiment of the present invention.

FIG. 4 shows a record-playback switching circuit for a serial drive circuit according to an embodiment of the present invention. The circuit shown in FIG. 4 is basically the same as the circuit shown in FIG. 3. In FIG. 4, SW1 and SW3 to SW5 are switches that are switched between record mode and playback mode. Common terminals of the switches SW1 and SW3 to SW5 are connected to R terminal in the record mode and to P terminal in the playback mode. RAc is a record amplifying circuit. PAa and PAb are playback amplifying circuits. HDa is an A channel head. HDb is a B channel head. SW2 is a switch that selects the A channel or the B chancel in the playback mode.

Next, the operation of the circuit according to this embodiment shown in FIG. 4 will be described. In the record mode, the switches SW1 and SW3 to SW5 are connected to their R terminals. Since the switch SW2 is not used in the record mode, it may be connected to any terminal. A record signal is supplied to an input terminal IN. The record signal is supplied to a record amplifying circuit RAc through the switch SW1. The output of the record amplifying circuit RAc is sent to a record head HDa through the switch SW3 and a condenser C1. The record current flows to the magnetic heads HDa and HDb that are connected in series. Thereafter, the record current flows to the ground through the switch SW4. The switch SW5 turns off the playback amplifying circuits PAa and PAb. Thus, in the record mode, the switch SW5 is not required.

Since the record heads HDa and HDb are connected in series, they have polarities. In FIG. 4, assume that the polarities of the upper side and lower side of each of the record heads HDa and HDb are "+" and "−", respectively. In the playback mode, a neutral point of the heads HDa and HDb is grounded so as to extract a signal. However, the polarity of the A channel is different from the polarity of the B channel.

The operation in the playback mode of this embodiment is the same as that of the embodiment shown in FIG. 3. Since the effect of the playback mode of this embodiment is the same as that of the embodiment shown in FIG. 3, the description thereof is omitted. However, the operation of the switch SW4 of this embodiment is different from that of the embodiment shown in FIG. 3. Next, the operation of the switch SW4 of this embodiment will be described.

Since the switch SW4 is connected in series with the magnetic heads HDa and HDb, it seems that unless the impedance is decreased, the frequency characteristic is adversely affected. However, when the record amplifying circuit RAc is current driven, it is not necessary to decrease the impedance. After the output current of the record amplifying circuit RAc flows to the magnetic heads HDa and HDb, it flows to the switch SW4 regardless of the impedance thereof. Even if the impedance of the switch SW4 varies, the record current does not vary. Thus, it is clear that the characteristics of the switch SW4 are not important.

Figure 11:
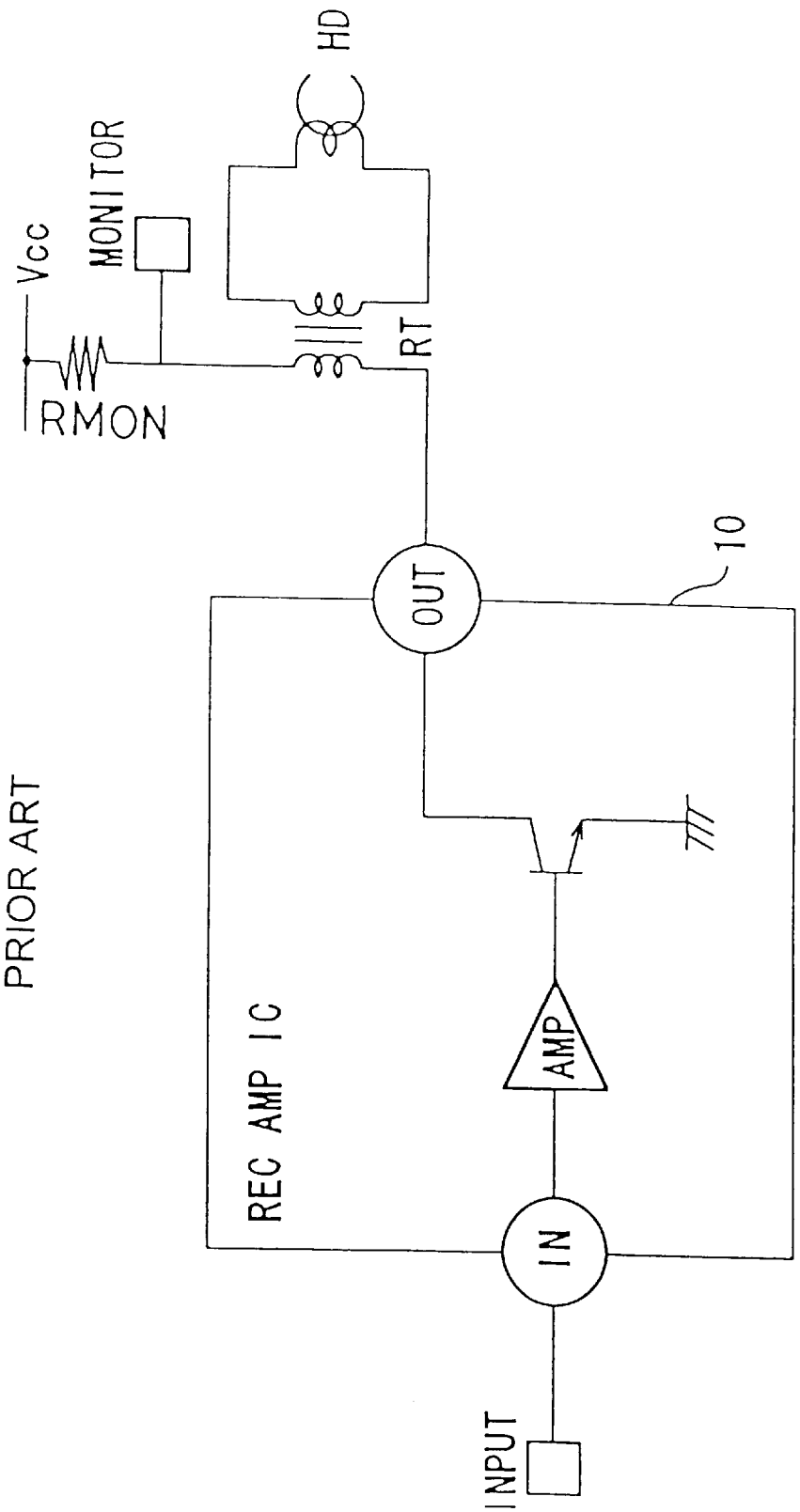
FIG. 11 is a schematic diagram showing a construction of a circuit of a conventional magnetic recording apparatus.

In addition, since the impedance of the switch SW4 has the same relation as the resistor R described in the related art reference shown in FIG. 11 in connecting conditions, it is not necessary to decrease the impedance of the switch SW4. However, since the intensity of the record current is as large as 30 mApp, the impedance thereof should be several ten ohms or less unlike with the impedance of one ohm or less of the switch described in the related art reference shown in FIG. 12. However, when the impedance of the switch SW4 is too large, the dynamic range of the record amplifying circuit becomes narrow. Nevertheless, the order of several ten ohms is 10 times rougher than the order of the resistance of the switch in FIG. 12. Thus, the switch SW4 can be easily accomplished with an electronic switch. Since the size of each elements of an IC is small, the on-resistance of each switch is large. Thus, in the related art reference, it is difficult to incorporate the switches into an IC. However, according to this embodiment, the switches can be easily incorporated into an IC.

Figure 5:
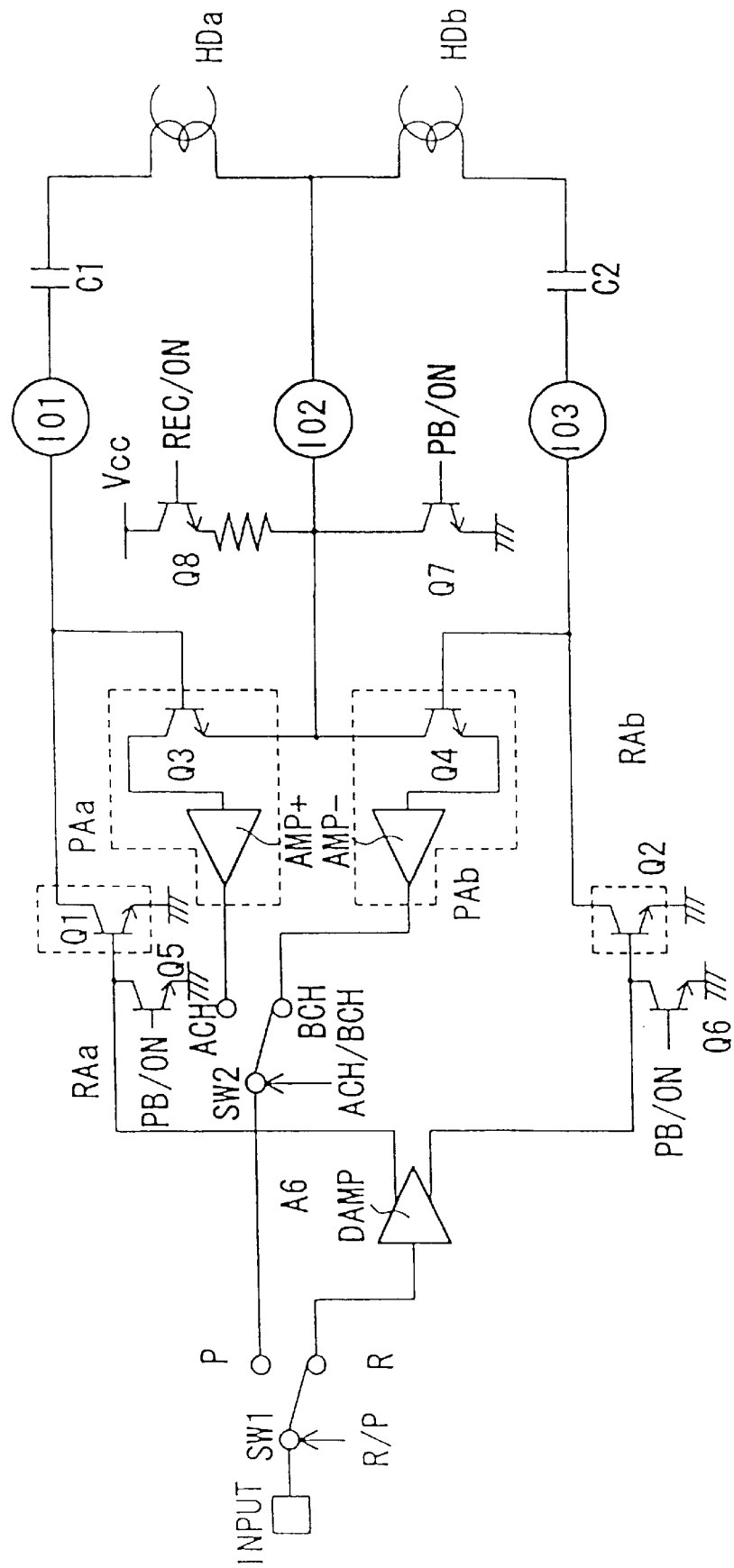
FIG. 5 is a schematic diagram showing a practical circuit of FIG. 3.

In FIGS. 3 and 4, record-playback switching circuits are described. However, in the circuits according to these embodiments, it seems that the switches SW3 and SW4 are difficult to accomplish. Since a playback signal is very weak, if switches are disposed in the input portion of the playback signal, noise that takes place in the switches is large, thereby lowering the S/N ratio. Next, a practical record-playback switching circuit for a differential drive circuit will be described. FIG. 5 shows this circuit according to an embodiment of the present invention. In this embodiment, the switches SW3 to SW5 in FIG. 3 are substituted with transistor circuits. This substitution can also apply to the switches in FIG. 4.

Referring to FIG. 5, Q1 and Q2 are transistors that are output stages of record amplifying circuits RAa and RAb, respectively. The transistors Q1 and Q2 differentially output record signal currents. Since the transistors Q1 and Q2 are of NPN type, they require a bias. However, the bias may be provided as with the circuit according to the embodiment shown in FIG. 1. Thus, only matters concerning AC will be described.

In FIG. 5, Q3 and Q4 are transistors that are first stages of the playback amplifying circuits PAa and PAb, respectively. To reduce noise, the first stage should have high gain. Thus, the transistors Q3 and Q4 are emitter-grounded amplifiers. The emitter-grounded amplifiers are often used for the first stages of the playback amplifying circuits. Q7 and Q8 are transistors that are equivalent to the switch SW5 of FIG. 3. "PB/ON" and "REC/ON" at the bases of the transistors Q5 to Q8 represent that these transistors are turned on.

In the record mode, the transistor Q8 is turned on, whereas the transistors Q5 to Q7 are turned off. In other swords, as the embodiment shown in FIG. 3, the transistors Q1 and Q2 differentially supply record currents to heads. Since the transistor Q8 is turned on, the base-emitter connections of the transistors Q3 and Q4 are reversely biased. Thus, the playback amplifying circuits PAa and PAb are turned off. Since the amplitude at the output terminal IO2 is very low, current does not almost flow to the resistor R.

Unlike with the record mode, in the playback mode, the transistor Q8 is turned off, whereas the transistors Q5 to Q7 are turned on. Thus, the base-emitter connections of the transistors Q1 and Q2 are zero-biased. Thus, the record amplifying circuits RAa and RAb are turned off. Since the transistor Q7 is turned on, the emitter voltages of the transistors Q3 and Q4 become almost 0 V. When the bases of the transistors Q3 and Q4 are properly biased, the playback amplifying circuits PAa and PAb are turned on. Thus, amplified playback voltages can be obtained.

In this construction, a record-playback switching circuit can be accomplished without need to dispose extra devices in the outputs of the record amplifying circuits RAa and RAb and the inputs of the playback amplifying circuits PAa and PAb. In this construction, the switches do not cause noise. In the playback mode, a single input differential amplifying circuit A6 that is a converting circuit, which converts an input signal into a differential current signal, can be turned off. Thus, when the impedance of the transistors Q5 and Q6 is sufficiently low, feed-back signals caused by parasitic impedance are remarkably attenuated.

In the playback mode, the transistors Q1 and Q2 are cut off. Thus, since the amount of feed-back signals is very small, the playback amplifying circuits do not oscillate with feed-back signals due to the parasitic impedance. Any switch of this embodiment do not require strict specifications for the on-resistance and off-resistance. Thus, this switching circuit can be easily accomplished. In addition, since the devices for the switching circuit are disposed in series with the signal path, characteristics do not deteriorate in both the record mode and the playback mode.

Figure 6:
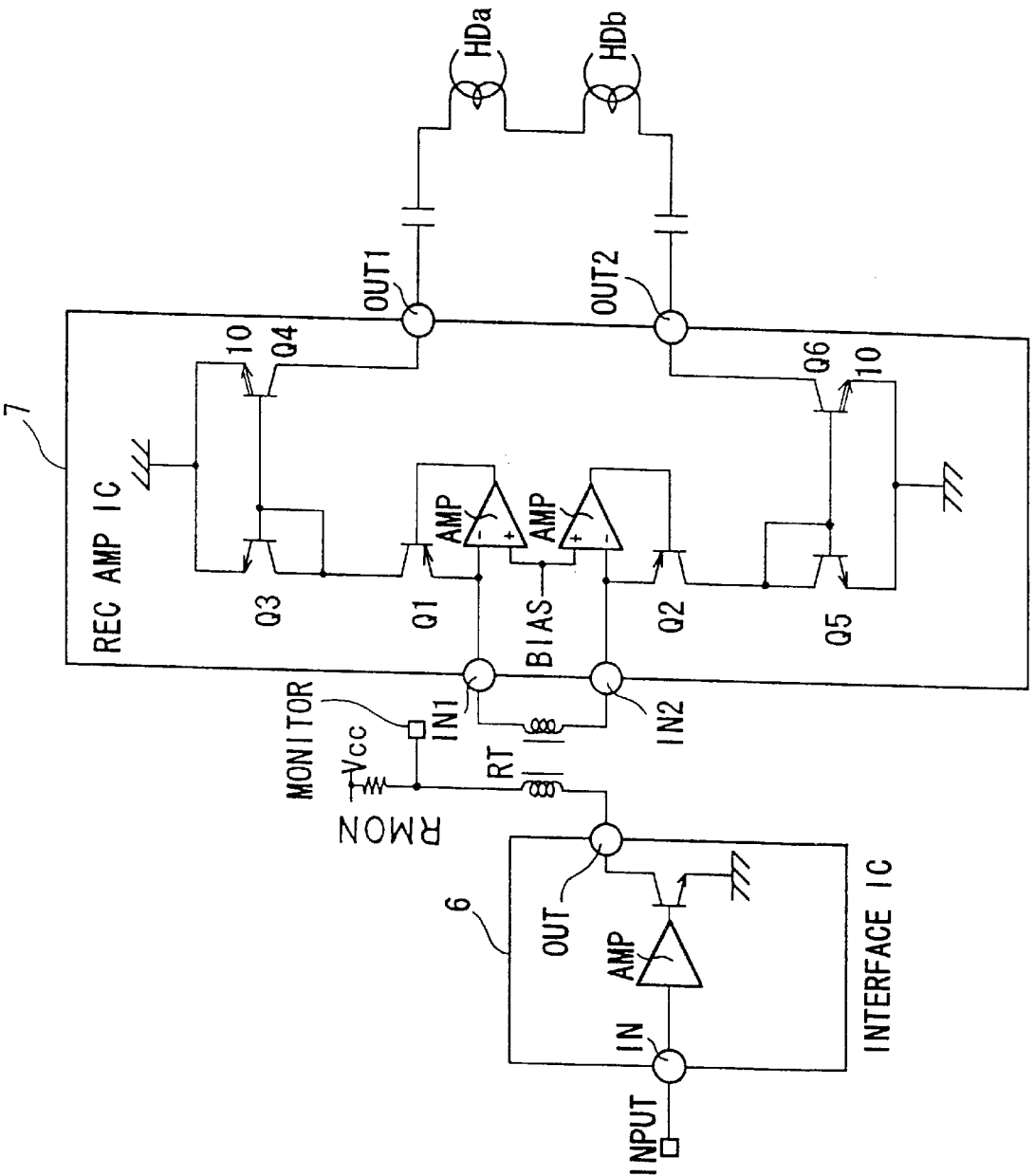
FIG. 6 is a schematic diagram showing a construction of a circuit for adjusting a record current according to an embodiment of the present invention.

When record amplifying circuits are disposed on a rotary cylinder, record current should be adjusted. In the construction whereby the record amplifying circuits are disposed on the rotary cylinder, while the magnetic recording apparatus is operating, the rotary cylinder rotates. Thus, record current cannot be measured. FIG. 6 shows a record current adjusting circuit for use with a record amplifying circuit disposed on a rotary cylinder according to an embodiment of the present invention.

In this embodiment, the construction of an IC that drives a rotary transformer is the same as that of the related art reference. However, since the record current is amplified by a record amplifying circuit disposed on a rotary cylinder, the intensity of the output current of an interface IC 6 shown in FIG. 6 may be not large. A record amplifying circuit 7 is disposed on the rotary cylinder. In the record amplifying circuit 7, current input circuits are disposed. The current input circuits include transistors Q1 and Q2 that are connected to a rotary transformer RT through terminals IN1 and IN2, respectively. After current flows in the rotary transformer RT, it flows to the transistors Q3 and Q4 through the transistor Q1. The transistors Q3 and Q4 form a current mirror circuit so as to amplify the intensity of the current. The amplified current flows to the magnetic head HDa. In addition, the current that flows in the rotary transformer RT flows to the transistor Q2. The output current of the transistor Q2 flows to the transistors Q5 and Q6. The transistors Q5 and Q6 also form a current mirror circuit. Thus, the transistors Q5 and Q6 amplify the intensity of the current. The amplified current flows to the magnetic head HDb.

It is clear that the phase of the signal current that flows in the transistor Q1 is reverse of the phase of the signal current that flows in the transistor Q2. Thus, the record amplifying circuit 7, which has two same circuits, differentially drives the magnetic heads HDa and HDb connected in series. Since the current that flows in the magnetic heads HDa and HDb is amplified without need to convert voltage, the influence of the record current by the transistors Q1 and Q2 is only 1/h fe. Thus, if the current amplification factors of the transistors are 100, which is the performance of conventional transistors, errors that take place in the transistors Q1 and Q2 are as low as 1%. These errors may be much reduced by Darlington connection.

With respect to the transistors Q3 and Q4 and the transistors Q5 and Q6, the influence of the base current can be easily reduced by the Darlington connection. These errors are caused by the pair characteristics of the current mirror circuits. However, the current mirror circuits supply a large current that is record current. Thus, the size of the resultant circuits increases and the pair accuracy of the devices improves. In the IC process, the relative accuracy of the devices is high. As the size of the devices increases, the accuracy thereof further improves. With respect to the current mirror circuits, the accuracy of 1% or 2% can be easily accomplished.

In the record amplifying circuit 7 disposed on the rotary cylinder according to this embodiment, when the construction of current input, current amplification, and current output is employed, very high accuracy can be accomplished. In addition, since the accuracy of the circuits downstream of the rotary transformer is high, it is not necessary to consider them. Thus, the record current can be monitored and adjusted on the circuit board side. In addition, errors can be reduced as low as 1% to 2% in accuracy. Even if the inductance of the rotary transformer deviates, the accuracy of the record current is not affected. In this case, the record current may be properly adjusted with a rough adjustment accuracy of 13% to 14%.

The input impedance of the rotary transformer is connected in series with the secondary inductance of the rotary transformer RT. Thus, unless the input impedance is low, the low band frequency characteristics are deteriorated. The input circuit of the rotary transformer can be constructed of a feed-back amplifying circuit as shown in FIG. 6. The feed-back amount of the feed-back amplifying circuit is high in low band. In addition, the feed-back amount of the feed-back amplifying circuit is low in high band because the phase compensation is required. The input impedance of the input circuit of the rotary transformer constructed of the feed-back amplifying circuit shown in FIG. 6 is low in low band and high in high band. Since the rotary transformer has an inductance, the impedance thereof is low in low band and high in high band. In other words, since the impedance of the input circuit of the rotary transformer constructed of the feed-back amplifying circuit is low in low band where impedance is important, this circuit is very advantageous. With one stage of the feed-back amplifying circuit, 60 dB of the open-loop gain of the feed-back amplifying circuit can be accomplished. Thus, the impedance of 1 ohm or less can be easily accomplished. In other words, the embodiment shown in FIG. 6 can provide excellent low band frequency characteristics.

Figure 7:
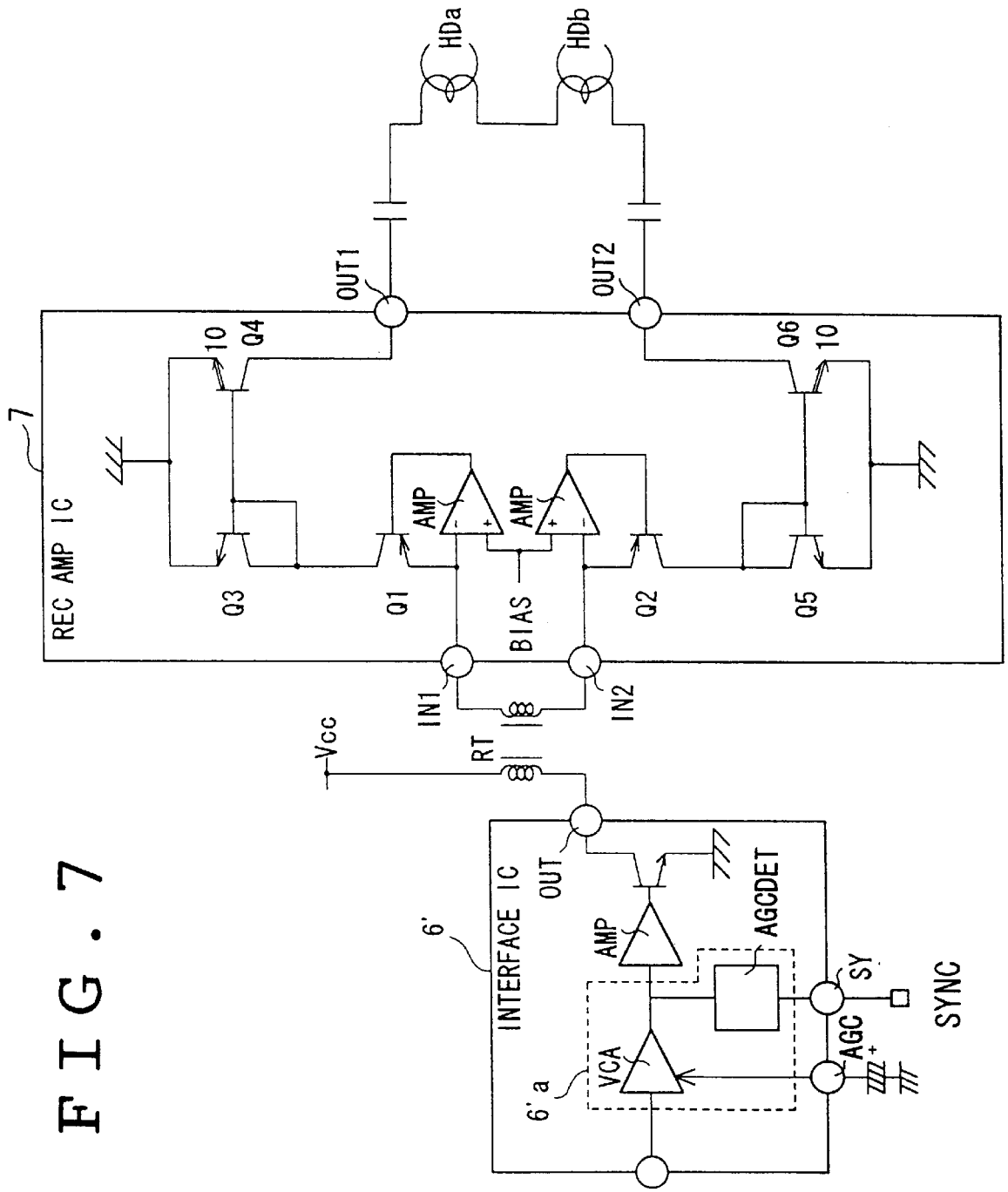
FIG. 7 is a schematic diagram showing a construction of a circuit for automatically adjusting a record current according to an embodiment of the present invention.

FIG. 7 shows a circuit for automatically adjusting a record current according to another embodiment of the present invention. In the embodiment shown in FIG. 6, since the record amplifying circuit 7 is disposed on the rotary cylinder, the record current adjustment accuracy can be as rough as 13%. With the accuracy of 5%, it is difficult to automatically adjust the record current. However, with the accuracy of 10% or higher, the record current can be automatically adjusted.

The construction of a record amplifying circuit of the embodiment shown in FIG. 7 is the same as that of the embodiment shown in FIG. 6. In the embodiment shown in FIG. 7, an AGC circuit is disposed on the input side of a rotary transformer RT.

A video record signal is composed of a color signal and a luminance signal. Since the luminance signal is frequency modulated, the amplitude is constant. Thus, the luminance signal can be easily adjusted. However, since the amplitude of the color signal varies corresponding to the brightness of color, it is difficult to adjust the color signal. Since a synchronous signal period does not contain a color signal, when a detecting circuit of an AGC circuit 6' is gated in synchronization with the synchronous signal received from a sync input SY of an interface IC6', the amplitude of the synchronous signal is detected, thereby automatically adjusting the record signal. Since the AGC circuit 6'a contains many error factors of the detecting circuit, smoothing circuit, comparing reference power supply, and so forth, it is difficult to adjust the record signal with an accuracy of 5%. However, with an accuracy of 10%, the record signal can be automatically adjusted. When the AGC circuit 6'a is disposed on a rotary cylinder, since the influence of the transmission gain of the rotary transformer can be also adjusted, the accuracy of record current is improved.

Figure 8:
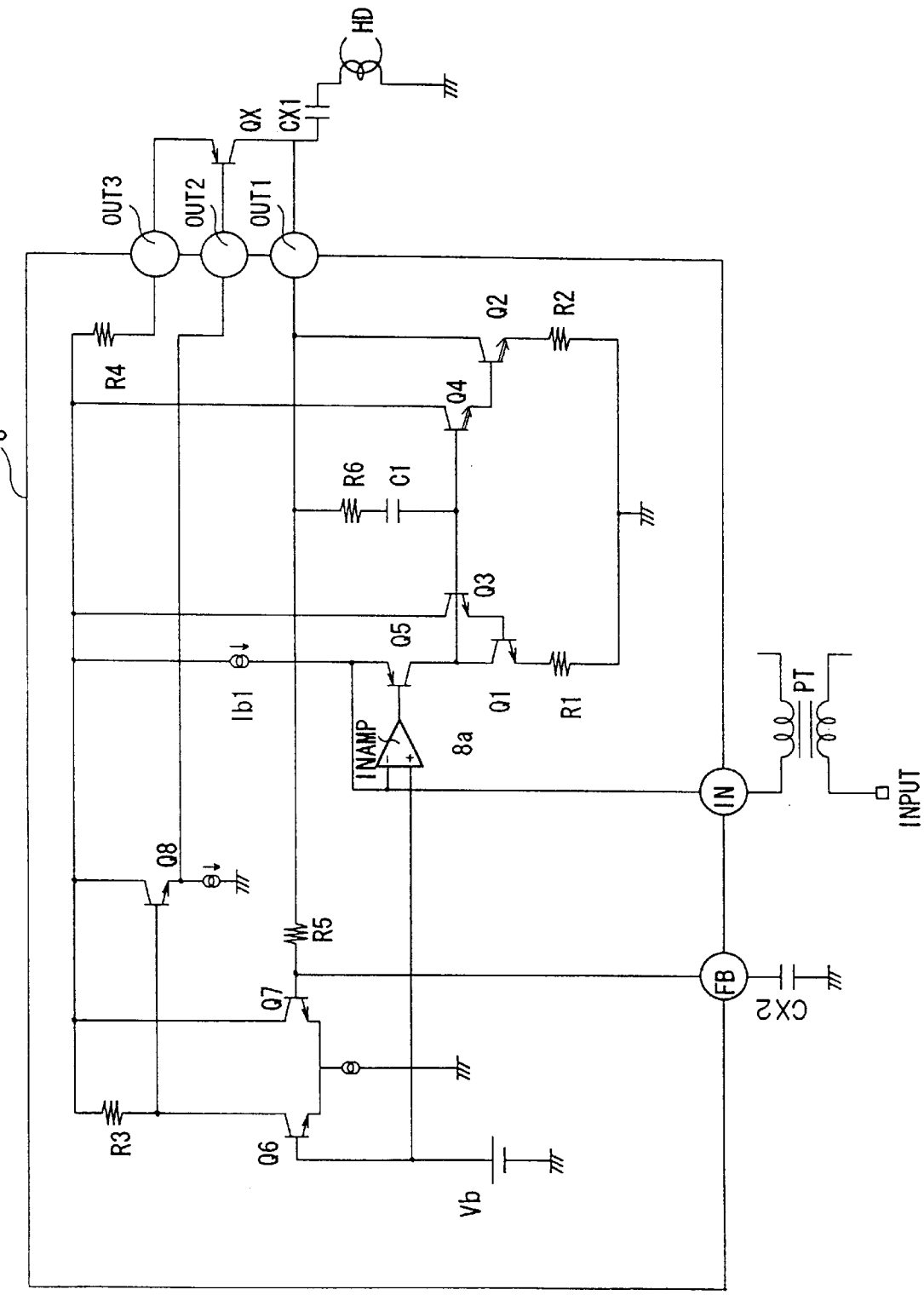
FIG. 8 is a schematic diagram showing a construction of a circuit of a combination of the embodiments of FIGS. 1 and 6.

FIG. 8 shows a circuit that is a combination of the circuits shown in FIGS. 1 and 6 according to an embodiment of the present invention. In this embodiment, the current gain of a record amplifying circuit 8 is 30. An input circuit of a rotary transformer RT is constructed of a transistor Q5 and an input amplifier 8a. An input current flows from the rotary transformer RT to an input terminal IN. Thereafter, the input current flows to transistors Q1 and Q2 through a transistor Q5. The transistor Q1 and Q2 form a current mirror circuit so as to amplify the input current as record current. The record current flows to a magnetic head HD. The current mirror circuit is Darlington connected so as to prevent the record current from being affected by the base current of the transistors.

A bias current flows from an external transistor QX to a transistor Q2 of the output stage of the record amplifying circuit 8. The record amplifying circuit 8 has a DC feed-back so that the average output voltage thereof becomes equal to a bias voltage Vb. A voltage of an output terminal Out1 is smoothed by a resistor R5 and a condenser CX2 and applied to the base of a transistor Q7. A differential circuit formed of the transistors Q6 and Q7 compares their voltages. When the DC voltage of the output terminal Out1 is high, the collector current that flows in the transistor Q6 decreases, the base voltage and emitter voltage of a transistor Q8 rise, the collector current of the external transistor QX decreases, and the DC voltage of the output terminal Out1 drops. The bias of the output stage of the record amplifying circuit 8 depends on a current source Ib1. (Ib1×30) is the bias current of the output stage of the transistor Q2.

In the condition that the DC feed-back is stable where the voltage of the output terminal Out1 is equal to the bias voltage Vb, all the collector current of the transistor Q2 flows to the external transistor QX. Since the base voltage of the external transistor QX is a DC component that is fed back, the transistor QX operates as a constant current source against the record signal. Thus, it is not important to consider the high frequency characteristics and current amplification factor of the external transistor QX. Since the signal current flows from the record amplifying circuit 8 to the magnetic head HD, the characteristics of the external transistor QX do not affect the signal.

A condenser Cl and a resistor R6 that are connected in series construct a feed-back dump that prevents high frequency oscillation. Since the magnetic head HD has an inductance, as the frequency rises, the impedance thereof increases. The voltage gain of the base of the transistor Q2 increases in proportion to the frequency. Thus, a signal is fed back between the collector and base of the transistor Q2 due to parasitic capacitance. As the frequency rises, the record amplifying circuit 8 tends to oscillate. The register R6 prevents the record amplifying circuit 8 from oscillating. Since the inductance of the magnetic head HD is at most 2.0 $\mu$H, the impedance thereof at 10 MHz is at most $2 \times \pi \times 10$ MHz $\times 2.0$ $\mu$H=125 $\Omega$.

Thus, when a resistor of several hundred ohms is connected in parallel with the magnetic head HD, the resonance can be dumped. However, the voltage amplitude of the output terminal Out1 is approximately 2 Vpp, several milliamperes of current flow in the dump resistor, which is connected to the magnetic head HD. This current is wasted. In addition, unless the resistor with several hundred ohms is stable, the record current leaks out. Thus, non-linearity of the dump resistor causes distortion. As shown in FIG. 3, when the record-playback mode is switched, unless the dump resistor is disconnected in the playback mode, noise takes place.

Thus, when the dump resistor is directly connected in parallel with the magnetic head, although distortion can be prevented, noise takes place. In contrast, when the dump resistor is grounded through an active device, although the noise can be prevented, distortion due to non-linearlity of the active device takes place. In this embodiment, feed-back dump method where current is fed back from the output terminal to the base of the current mirror transistor through the resistor R6 is disclosed. The transistor Q2 on the output stage functions like a diode. When the output impedance of the output terminal Out1 is considered, since the transistor Q2 treated as a collector, the impedance is ignorably high.

The resistor R6 looks like a serial circuit of transistors Q3 and Q1 that function as diodes and a resistor R1. Current 30 times as much as the collector current of a transistor Q1 flows in the transistor Q2. Since the diode impedance and the resistance of the resistor R1 are smaller than the resistance of the resistor R6, now assume that they are omitted. Thus, the impedance is given by R6/(30+1). When the resistance of the resistor R6 is 10 kΩ, the output impedance of the record amplifying circuit is as low as approximately 300 Ω. In addition, since the resistance of the resistor R6 is actually as large as 10 kΩ, the distortion due to non-linearlity can be prevented and the power consumption can be reduced.

When a record amplifying circuit that is constructed of the current amplifying circuit as shown in FIG. 6 is disposed on a rotary cylinder, unlike with the conventional signal processing circuit, the intensity of the signal that flows from the input terminal of the rotary transformer to the output terminal of the record amplifying circuit depends on the intensity of the current. The accuracy of the absolute value of resistors formed in an IC is low. In other words, the resistors formed in an IC have an error of ±20%. When the bias of a record current circuit is given by an internal resistance of an IC, bias current should be designated so that the circuit operates even if the internal resistance of the IC increases. Thus, when the circuit is designed, a margin of 20% should be considered. When resistors with small resistance are formed, a bias current larger than the margin by 20% flows. Thus, the current consumption increases by 40% in total.

As described in the embodiments shown in FIGS. 1 and 2, almost the upper limit of power is used for one chip. In particular, when the record amplifying circuit is disposed in the rotary cylinder, a small package should be used because of the limited space of the circuit board. In addition, the power consumption should be strictly controlled without loss. Although the circuit according to the each of the embodiments shown in FIGS. 1 and 2 can be incorporated into one chip, since another circuit may be incorporated into the chip so as to improve the function of the record amplifying circuit, the power consumption should be as low as possible. As an example of the different circuit, which improves the function, an automatic record current adjustment circuit may be incorporated into the record amplifying circuit IC disposed on the rotary cylinder.

Figure 9:
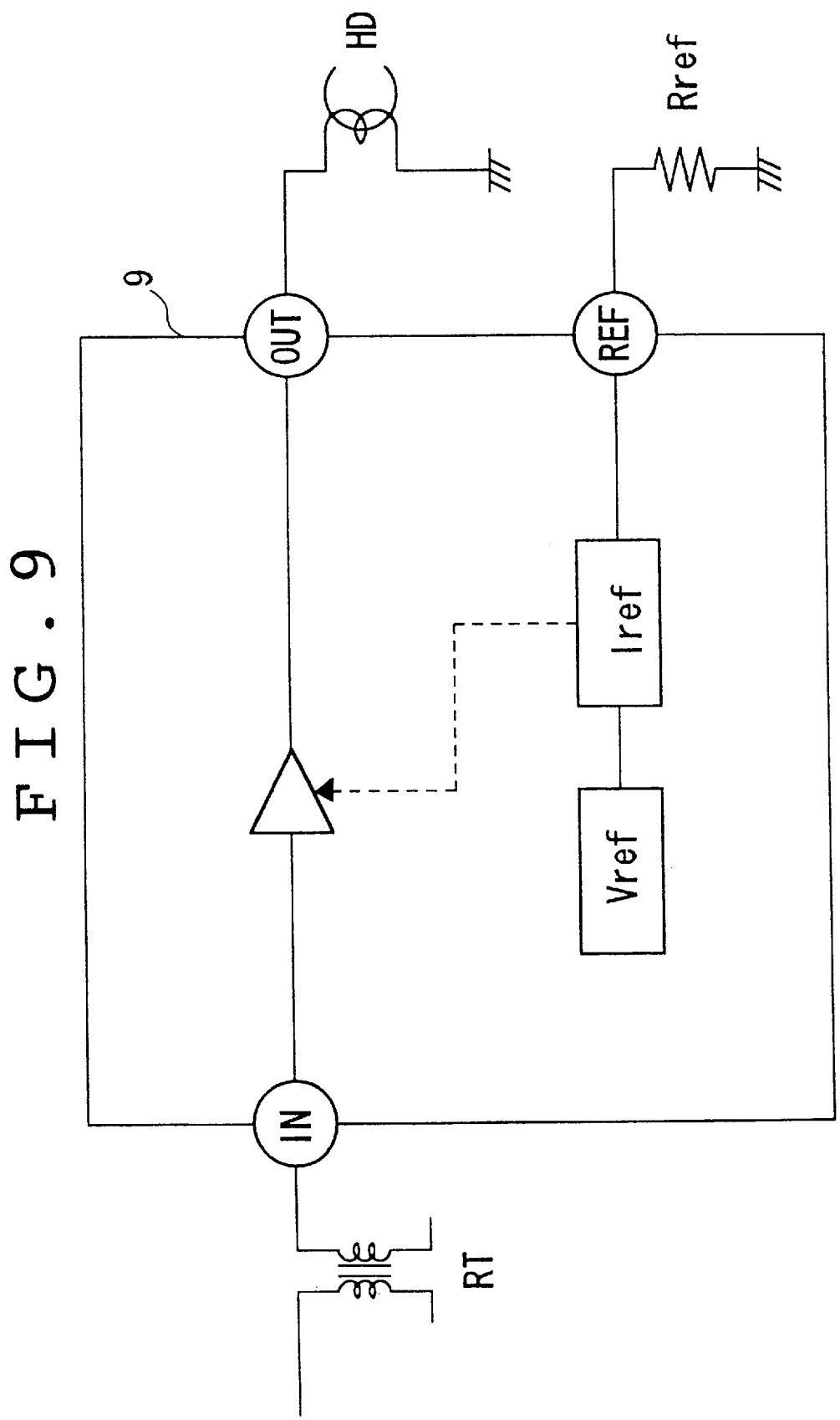
FIG. 9 is a schematic diagram showing a construction of a bias method of a recording amplifier with a reference current according to an embodiment of the present invention.

FIG. 9 shows an automatic record current adjusting circuit that is incorporated into a record amplifying circuit IC disposed on a rotary cylinder according to an embodiment of the present invention. In FIG. 9, IC9 has a reference voltage circuit Vref. An external resistor Ref is disposed outside the IC 9. A reference current circuit Iref applies a reference voltage produced by the reference voltage circuit Vref to the external resistor Rref. Thus, a reference constant current corresponding to the current that flows in the external resistor Rref takes place. When a bias current corresponding to the reference constant current is supplied to the record amplifying circuit, the bias current does not depend on the internal resistance of the IC.

The dynamic range of the record amplifying circuit depends on the ratio of the record current and the bias current. The record current depends on the specification of the magnetic recording apparatus. The bias current depends on the external reference resistance. The dynamic range of the record amplifying circuit does not depend on the internal resistance of the IC, Even if the same IC is applied to a different system, the power consumption and dynamic range can be optimized corresponding to the intensity of the record current.

Thus, in the record amplifying circuit disposed on the rotary cylinder, when the bias current of the record amplifying circuit is supplied by the external reference resistor, the dynamic range becomes constant regardless of a fabrication error of the IC. In addition, the power consumption becomes constant. Thus, the margin of the bias current is not required. Consequently, the power consumption can be substantially reduced by approximately 40%.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. An amplifying circuit for a magnetic record and playback apparatus, comprising:

a set of magnetic heads including, first and second magnetic heads having first and second windings, respectively, first ends of said first and second windings being connected to a common point;

a first playback amplifying circuit having first and second input terminals, the first input terminal being connected to the common point;

a second playback amplifying circuit having first and second input terminals, the first input terminal being connected to the common point;

selecting means for selecting an output of one of the first playback amplifying circuit and the second playback amplifying circuit;

an output terminal connected to the selecting means;

inputting means for inputting a first recording signal and a second recording signal, a polarity of the first recording signal being different from a polarity of the second recording signal;

a first record amplifying circuit having an input terminal and an output terminal, the input terminal receiving the first recording signal, and the output terminal and the second input terminal of said first playback amplifying circuit being alternatively connected to a second end of said first winding through first switching means; and a second record amplifying circuit having an input terminal and an output terminal, the input terminal receiving the second recording signal, and the output terminal and the second input terminal of said second playback amplifying circuit being alternatively connected to a second end of said second winding through second switching means.

2. The circuit as set forth in claim 1, further comprising:

an input terminal inputting a recording signal; and wherein the inputting means comprises a signal input differential output amplifier connected to receive the recording signal from the input terminal and to output the first and second recording signals.

3. An amplifying circuit for a magnetic record and playback apparatus, comprising:

a set of magnetic heads including first and second magnetic heads having first and second windings, respectively, first ends of said first and second windings being connected at a common point;

a first stage transistor having an emitter, a base, and a collector, the emitter being connected to the common point; and an output stage transistor having an emitter, a base, and a collector, an output at a second end of said first winding being applied to the base of said first stage transistor and the collector of said output stage transistor.

4. The circuit as set forth in claim 3, wherein the output at the second end of said first winding is applied to the base of said first stage transistor and the collector of said output stage transistor through a capacitor.

* * * * *